United States Patent
Kou

(10) Patent No.: US 7,290,701 B2
(45) Date of Patent: Nov. 6, 2007

(54) GATHERING DATA RELATING TO ELECTRICAL COMPONENTS PICKED FROM STACKED TRAYS

(75) Inventor: Yuen-Foo Michael Kou, Andover, MA (US)

(73) Assignee: Accu-Assembly Incorporated, Andover, MA (US)

( * ) Notice: Subject to any disclaimer, the term of this patent is extended or adjusted under 35 U.S.C. 154(b) by 512 days.

(21) Appl. No.: 10/918,158

(22) Filed: Aug. 13, 2004

(65) Prior Publication Data

US 2006/0032902 A1    Feb. 16, 2006

(51) Int. Cl.
*G06F 7/00* (2006.01)
(52) U.S. Cl. .................. 235/376; 235/375; 235/462.01
(58) Field of Classification Search ........... 235/462.01, 235/385, 376, 375; 29/700
See application file for complete search history.

(56) References Cited

U.S. PATENT DOCUMENTS

| | | | |
|---|---|---|---|
| 5,329,690 A | 7/1994 | Tsuji et al. | |
| 5,421,455 A | 6/1995 | Clatanoff et al. | |
| 5,547,082 A | 8/1996 | Royer et al. | |
| 5,565,008 A | 10/1996 | Shigetomo et al. | |
| 5,984,176 A * | 11/1999 | Koda et al. | 235/376 |
| 6,334,115 B1 | 12/2001 | Kuribayashi et al. | |
| 6,531,675 B2 * | 3/2003 | Faitel | 219/121.63 |
| 6,718,629 B1 | 4/2004 | Stanzl | |
| 6,813,539 B2 * | 11/2004 | Morimoto et al. | 700/215 |
| 6,994,258 B2 * | 2/2006 | Lewis | 235/472.01 |
| 2002/0168147 A1 * | 11/2002 | Case et al. | 385/53 |

FOREIGN PATENT DOCUMENTS

EP    0 476 577    3/1992

* cited by examiner

*Primary Examiner*—Thien M. Le
*Assistant Examiner*—Edwyn Labaze
(74) *Attorney, Agent, or Firm*—Fish & Richardson P.C.

(57) ABSTRACT

A method of identifying electrical components picked from trays stacked in a tray tower of an electrical component placement machine includes placing identification tags on each tray. The tags contain data correlated to component part and lot number. As the stack of trays is moved into position for component picking, the tag of the upper tray is read by a tag reader. Gathered data is employed for component tracking, inventory control and setup verification.

36 Claims, 1 Drawing Sheet

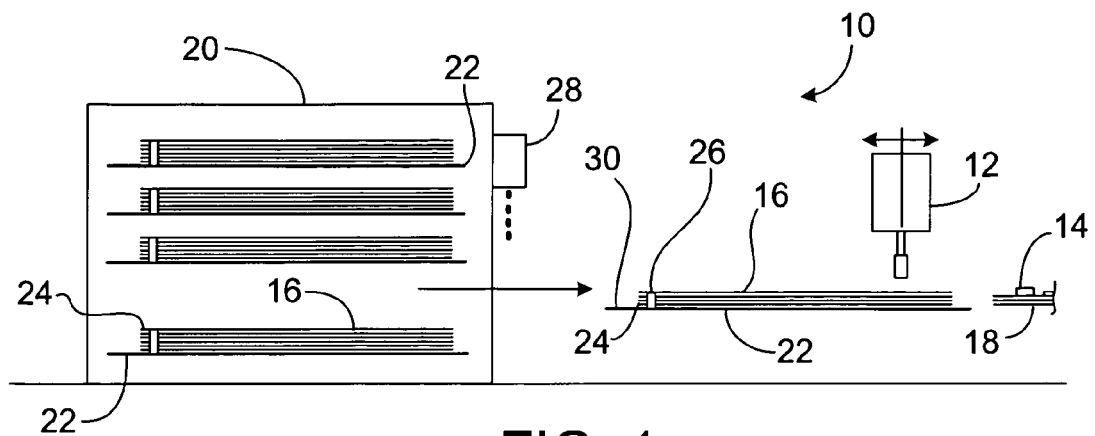
FIG. 1
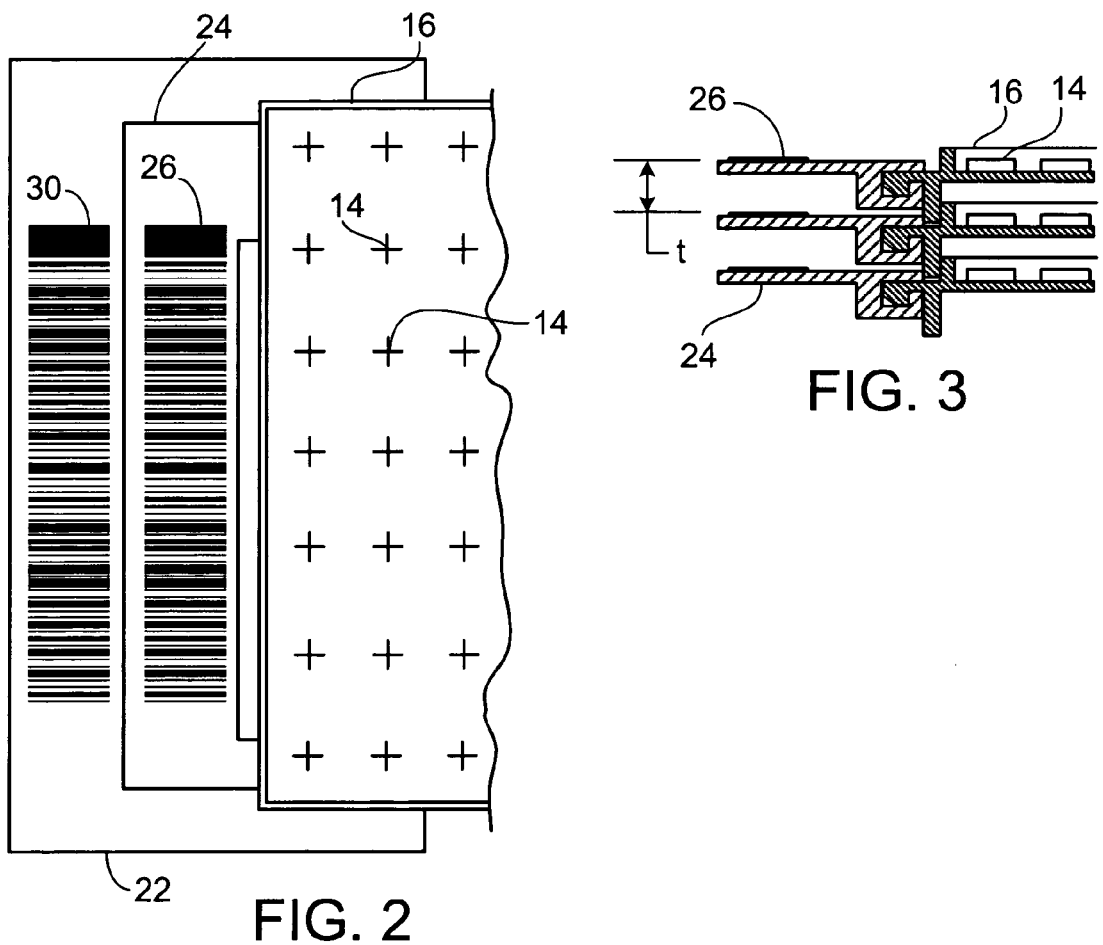
FIG. 2
FIG. 3

GATHERING DATA RELATING TO ELECTRICAL COMPONENTS PICKED FROM STACKED TRAYS

TECHNICAL FIELD

This invention relates to gathering data relating to electrical components picked from stacked trays, such as on an electrical component placement machine, and to using such gathered data to verify machine configuration and to track quality and inventory of such components.

BACKGROUND

Many expensive electronic components are packaged in trays, in which multiple discrete components are arranged in a matrix on each tray. The trays are designed so that multiple trays can be stacked together to increase the number of components positioned in one place, such as for transport or on a pick-and-place board assembly machine. During transport, each stack of trays is tied together with strapping material and packaged inside Electro-Static Discharge (ESD) bags. Typically, each stack of tray carries components of the same part number and lot code, with the part number and lot code information printed on a label attached to the outside of the bag. No identification of the components is generally available inside the bag, nor is such identification printed on the tray. If the trays are removed from such bags, the user must carefully preserve the identity of the components in the trays.

Electrical components are usually placed onto printed circuit boards by a component placement machine. The most common configuration for components provided on trays is a tray tower on the placement machine. Trays of different part numbers are placed onto different 'movable' drawers inside the tray tower. At least one tray of components can be placed into each drawer. Sometimes, a stack of trays can be placed onto one drawer and the placement machine can remove the tray on the top of the stack after all the components on the top tray are consumed. The placement machine selects different part numbers by moving the entire drawer assembly up and down, or otherwise positioning the pick head with respect to a desired drawer. The drawer with the desired part number is then pulled out from the tray tower for picking. In many machines, the dispensing of the components is always at the same level since the pick up mechanism of the placement machine is configured to always pick up components at the same vertical position.

Many component verification systems require the operator to scan a part number barcode label on the bag in which the components are delivered. Then the operator scans the drawer number and the software verifies if the part number and the drawer number are a correct match. This approach is dependent on the operator scanning the correct part number and drawer number, and in many situations, trays from different bags are mixed into a single stack of trays. Some have suggested placing unique barcode labels to the bottom of each drawer, and scanning the barcode when the drawer is pulled out from the tower. Barcode scanning has also been employed to verify proper configuration of component reels and corresponding slots on placement machines. Other approaches to component identification and verification have also been considered or may be in use.

SUMMARY

One aspect of the invention provides a method of identifying electrical components picked from trays stacked in an electrical component placement machine. The method includes providing each of multiple electrical component trays with an associated identification tag, with the tags placed in a common orientation on the trays, and stacking a plurality of the trays to form a stack of trays, with each tray carrying at least one discrete electrical component, on a selected one of multiple tray support surfaces of an electrical component placement machine, with one of the stacked trays positioned at a distal end of the stack. The method also includes picking an electrical component from the tray at the distal end of the stack, for installation in an electrical assembly, and, with the placement machine continuing to operate to pick and place electrical components, gathering data from the identification tag of the tray at the distal end of the stack, the gathered data related to the picked electrical component.

In some arrangements the trays are stacked vertically, with the tray at the distal end of the stack positioned on top of the stack. For example, the data may be gathered from the identification tag by reading the tag with a tag reader positioned above the stack.

In some machines, the multiple tray support surfaces are movable drawers of the placement machine.

In many embodiments, the data is gathered from the identification tag by reading the tag with a tag reader, such as a reader positioned beyond the distal end of the stack. Preferably, the reader is blocked from reading the identification tags of trays of the stack other than the tray at the distal end of the stack.

In some cases, the method also includes removing the tray at the distal end of the stack to expose an adjacent tray of the stack for component picking and tag reading.

The data may be gathered by optically reading the identification tag of the tray at the distal end of the stack. For example, the identification tags may carry bar codes, such as bar codes that signify the gathered data. The identification tags may be labels applied to the trays.

In some examples the data is gathered by electronically sensing properties of the identification tag of the tray at the distal end of the stack. For example, the identification tags may be RFID tags.

In some embodiments, the data is gathered from the identification tag by reading the tag with a tag reader mounted above a path along which the stack of trays moves for access by a pick head of the placement machine, such that the identification tag of the tray at the distal end of the stack is read by the tag reader as the stack of trays is positioned for picking.

The gathered data may also include tray identification information, the method further including retrieving component data from a stored correlation of components and trays.

In some embodiments, the identification tags are releasably attached to respective trays. For example, the identification tags may be carried on clips configured to be attached at an edge of each tray. Preferably each clip is of such a thickness, measured in a stacking direction of the stack of trays, that adding the clips to the trays does not affect an overall stack height of each tray.

In some instances the method also includes, while gathering data related to the picked electrical component, gathering data related to the selected tray support surface on which the stack of trays is stacked. For example, each of the multiple tray support surfaces may carry a unique, machine-readable identification tag, such as a bar code label. The method can also include comparing the gathered data related to the picked electrical component and gathered data related to the selected tray support surface on which the stack of trays is stacked, with a stored correlation between components and support surfaces, to verify proper tray placement.

Another aspect of the invention provides a method of tracking electrical component inventory in a facility containing one or more electrical component placement machines. The method includes serially picking electrical components from one of a stack of trays of components, while identifying the picked components according to the method described above, and updating stored electrical component inventory data based upon the gathered data related to the picked electrical components.

Another aspect of the invention provides a method of forming an association between assembled electrical boards and individual electrical components mounted on the boards. The method includes serially picking electrical components and placing the picked electrical components on an electrical board, at least one of the picked components being identified while picked from a stack of trays of components according to the method described above, and storing an association of the identified electrical component with an identification of the electrical board.

Another aspect of the invention features an electrical component identification system including a set of tray identification tags, a tag reader, and a controller. The tray identification tags are secured to associated, stackable trays of electrical components configured to be stacked on one of multiple tray support surfaces of an electrical component placement machine, with one of the stacked trays positioned at a distal end of the stack. The tag reader is configured to be secured to an electrical component placement machine in a position for reading the identification tag secured to the tray positioned at the distal end of the stack, to gather data therefrom while the placement machine is operated to pick and place electrical components onto a circuit board. The controller is configured to be connected to the tag reader for receiving the gathered data from the tag reader related to electrical components on its associated tray.

The identification tags may carry bar codes, and/or include RFID tags.

In some cases, the identification tags are releasably attached to respective trays. For example, the identification tags may be carried on clips configured to be attached at an edge of each tray.

Some embodiments of the system also include a set of machine-readable identification tags configured to be secured to respective ones of the multiple tray support surfaces. The machine-readable identification tags may be in the form of bar code labels, for example. In such embodiments, the controller may be advantageously configured to compare the gathered data related to the picked electrical component and gathered data related to the selected tray support surface on which the stack of trays is stacked, with a stored correlation between components and support surfaces, to verify proper tray placement.

In some examples the controller is configured to be connected to multiple tag readers on multiple component placement machines, to track electrical component inventory in a facility containing the machines.

The controller may also be advantageously configured to form an association between assembled electrical boards and individual electrical components mounted thereon, based in part on the gathered data.

In some cases the gathered data includes tray identification information, with the controller configured to retrieve component data from a stored correlation of components and trays.

The invention as described herein can be employed to reduce the chance of component loading error by continuously checking the arrangement of trays on a placement machine and alerting the operator before a mistaken component is placed. Advantageously, the system need not require the machine to sit idle while tray arrangement is checked. In addition, the invention can provide accurate component inventory information, track individual drawer use for maintenance purposes, and track components by lot for quality control purposes. The basic components of the system are readily installed on conventional placement machines with tray towers or the like.

The details of one or more embodiments of the invention are set forth in the accompanying drawings and the description below. Other features, objects, and advantages of the invention will be apparent from the description and drawings, and from the claims.

DESCRIPTION OF DRAWINGS

FIG. 1 schematically illustrates an electronic component placement machine with a tower containing several stacks of component trays on respective drawers.

FIG. 2 is a partial top view of one drawer and tray stack, showing barcode label identification tags, taken from perspective 2-2 in FIG. 1.

FIG. 3 is a partial cross-sectional view of one end of a stack of trays with associated identification tag clips, taken along line 3-3 in FIG. 2.

Like reference symbols in the various drawings indicate like elements.

DETAILED DESCRIPTION

Referring to FIG. 1, an electrical component placement machine 10 includes a movable pick head 12 that sequentially picks discrete electrical components 14, such as BGA (ball grid array) components, or components with discrete pins or leads, such as quad flat pack chips, for example, from a tray 16 carrying several such components, and places them on a printed circuit board 18 as part of a circuit board assembly process. Such machines are sometimes referred to as 'pick-and-place' machines. A tray tower 20 holds several trays 16 of individual components, placed on a series of drawers 22. Generally, all of the components on the stack of trays on a given drawer 22 are of the same specification, with a correspondence of drawer number and component part number stored in machine memory. When the board build sequence requires the pick head to pick a particular component, the drawers 22 move up or down within the tray tower to place the appropriate drawer containing that component in an active position for retrieval, then the selected drawer is slid out of the tray tower and into position for access by the pick head. If the upper tray 16 of the stack of trays on the drawer is empty, some placement machines include a mechanism to remove the empty, upper tray to expose the next tray for picking. Generally, such tray towers, tray ejection mechanisms and pick head configurations are known in the art.

In the system shown in FIG. 1, each tray 16 is equipped with a clip 24 carrying an identification tag in the form of a bar code label 26 (FIG. 2) on its upper surface. The tags 26 are all placed in a common orientation on the stack of trays (in this example, they all face upward). Referring also to FIGS. 2 and 3, the molded plastic clips 24 slide or clip onto edge features of the trays, such that they may be removed from the discarded trays and reused. In another configuration (not shown) the bar code labels or other means of identification are placed directly onto, or incorporated into, the trays, which may be designed to have a wide flange area for tag placement. The clips 24 in this illustrated embodiment, however, are designed to slide directly onto trays of the JEDEC style in common use, such that no tray modifications are necessary.

Referring back to FIG. 1, as the active drawer 22 slides out of the tray tower 20, its identification tag bar code label 26 is read by a tag reader 28 (in this case, a bar code scanner) attached to the front side of the tray tower and directed downward toward the opening in the tray tower through which the drawers slide. Due to the positioning of the reader, and the full overlap of the tags 26, only the identification tag of the upper tray 16 of the stack is read, as the reader is blocked from reading the identification tags of trays other than the tray at the top of the stack. When the upper tray is ejected as empty, on the subsequent motion of the tray stack out of the tray tower, tag reader 28 will read the now-exposed identification tag of the next tray of the stack. As the active drawer 22 is slid back into the tray tower, and passes back under the tag reader 28, the reader may also scan the tag of the upper tray to confirm, for example, that a tray emptied by the last pick has been properly ejected from the stack.

In another example, tags 26 are RFID tags, and reader 28 is an RFID reader. In that example, tags 26 are placed on clips that shield lower tags 26 of the stack from being sensed by the RFID reader.

Identification tags 26 contain information relating to the components 14 on the tray 16 to which the tag is attached. In this example, the bar code labels 26 identify the part number and lot number of the components. In other examples, the information relating to the components 14 may include an identification of the tray, from which component identification and other information may be obtained from an associated database. Thus, as the drawer moves out of the tray tower for component picking by the pick head, the machine can verify, via the tag reader 28, that the proper part number is being picked for placement on the board, and can also record the manufacturer, lot number, and other information about the picked component. In this manner, a data set relating to each assembled circuit board can be generated as the board is populated, including a list of all components assembled onto the board. Such data sets can be useful in tracking component quality, for example.

Because the identification tags 26 are secured to respective trays 16, rather than to the drawers 22, trays from different manufacturers, lot codes or trace codes can be stacked together on one drawer without affecting proper identification by the tag reader.

Referring to FIG. 3, each clip 24 is of an overall thickness 't' such that the height of the stack of trays 16 is not affected by the presence of the clips. In other words, the overall stack height of each tray (i.e., the incremental increase in height of the stack of trays from adding a tray to the stack) is not affected by the clips.

Referring back to FIGS. 1 and 2, each drawer 22 is also provided with a unique, machine-readable identification tag 30, in this case another barcode label. Drawer tags 30 are placed on an upper side of each drawer or other tray support surface, and positioned to be scanned by reader 28 as the drawer slides into and out of tray tower 20. Thus, as any drawer 22 slides out of the tray tower for component picking, the system reads both the upper tray tag 26 and the drawer tag 30, by means of the same reader 28. The system is thus able to confirm that the proper drawer has been retrieved, and that the proper parts are installed on that drawer. This information can be compared to a stored, desired correlation of part numbers and drawers, to verify proper tray placement.

Data gathered through the tag reader 28 is employed to track electrical component inventory, such as in a facility containing one or more electrical component placement machines equipped with such readers. For example, all of the machines may be linked for communication with a processor connected to a storage medium containing stored electrical component inventory data, such that the stored data may be updated based upon the gathered data related to the picked electrical components. The gathered data may also be employed to form associations between assembled electrical boards and the individual electrical components mounted on the boards, such as for quality control purposes. For example, if a component lot assembled onto boards is later determined to be defective and require board recall, the boards containing components from that lot can be identified by serial number from the stored association. Various implementations and algorithms for in-plant data gathering, inventory, quality and process control can be found in my U.S. Pat. No. 6,027,019 and pending U.S. application Ser. No. 09/723,202. Environmental condition recorders can also be incorporated into the identification tags or clips, as discussed in my U.S. Pat. No. 6,759,862 and pending U.S. application Ser. No. 10/402,191. Both of the above issued patents and both of the referenced pending applications are hereby incorporated by reference in their entirety.

One example of an in-plant procedure for machine setup is as follows. First, the operator receives a stack of trays of components of the same part number, enclosed inside a plastic moisture barrier bag or electro-statically protected bag. The operator removes the stack of trays from inside the bag, and attaches a clip 24 with an identification tag 26 to each tray. Each identification tag 26 is unique. The operator then scans the part number and other information from the label on the bag in which the stack of trays was received, and scans each tag 26 attached to the trays from that bag. The scanned component information is thus associated with all of the tags 26 in a data base, without the need for manual scanning at the machine. The stack of trays can then either be issued to the floor for production, or back to storage. In production, the operator simply puts the desired tray onto the proper drawer in the placement machine. As the drawer is being pull from the tray tower in production, the barcode scanner 28 scans the barcode label 26 on the tray 16 and the drawer 22, thereby identifying the drawer location (slot) and the part number. This information is then compared with the placement program to make sure that the correct part number is in the drawer. This system can also be used in conjunction with a traceability system to identify the origin of the part number.

The association of drawers and component part numbers can also be done automatically when the drawer is pulled out by the machine. For example, various sets of trays can be placed in any open drawer as the machine is set up, with the machine then programmed to pull out each drawer in turn and scan the drawer and tray tags to establish the setup configuration.

If attaching adhesive barcode labels directly to thin plastic component trays, care must be taken not to adhere two or more trays together by the label, thus risking ejection of multiple trays when the upper, empty tray is ejected.

A number of embodiments of the invention have been described. Nevertheless, it will be understood that various modifications may be made without departing from the spirit and scope of the invention. Accordingly, other embodiments are within the scope of the following claims.

What is claimed is:

1. A method of identifying electrical components picked from trays stacked in an electrical component placement machine, the method comprising
providing each of multiple electrical component trays with an associated identification tag, the tags placed in a common orientation on the trays;
stacking a plurality of the trays to form a stack of trays, each tray carrying at least one discrete electrical component, on a selected one of multiple tray support surfaces of an electrical component placement machine, with one of the stacked trays positioned at a distal end of the stack;
picking an electrical component from the tray at the distal end of the stack, for installation in an electrical assembly; and,
with the placement machine continuing to operate to pick and place electrical components, gathering data from the identification tag of the tray at the distal end of the stack, the gathered data related to the picked electrical component.

2. The method of claim 1, wherein the trays are stacked vertically, with the tray at the distal end of the stack positioned on top of the stack.

3. The method of claim 2, wherein the data is gathered from the identification tag by reading the tag with a tag reader positioned above the stack.

4. The method of claim 1, wherein the multiple tray support surfaces comprise movable drawers of the placement machine.

5. The method of claim 1, wherein the data is gathered from the identification tag by reading the tag with a tag reader.

6. The method of claim 5, wherein the reader is positioned beyond the distal end of the stack.

7. The method of claim 5, wherein the reader is blocked from reading the identification tags of trays of the stack other than the tray at the distal end of the stack.

8. The method of claim 1, further comprising removing the tray at the distal end of the stack to expose an adjacent tray of the stack for component picking and tag reading.

9. The method of claim 1, wherein the data is gathered by optically reading the identification tag of the tray at the distal end of the stack.

10. The method of claim 9, wherein the identification tags carry bar codes.

11. The method of claim 10, wherein the bar codes signify the gathered data.

12. The method of claim 1, wherein the identification tags comprise labels applied to the trays.

13. The method of claim 1, wherein the data is gathered by electronically sensing properties of the identification tag of the tray at the distal end of the stack.

14. The method of claim 13, wherein the identification tags comprise RFID tags.

15. The method of claim 1, wherein the data is gathered from the identification tag by reading the tag with a tag reader mounted above a path along which the stack of trays moves for access by a pick head of the placement machine, such that the identification tag of the tray at the distal end of the stack is read by the tag reader as the stack of trays is positioned for picking.

16. The method of claim 1, wherein the gathered data comprises tray identification information, the method further including retrieving component data from a stored correlation of components and trays.

17. The method of claim 1, wherein the identification tags are releasably attached to respective trays.

18. The method of claim 17, wherein the identification tags are carried on clips configured to be attached at an edge of each tray.

19. The method of claim 18, wherein each clip is of such a thickness, measured in a stacking direction of the stack of trays, that adding the clips to the trays does not affect an overall stack height of each tray.

20. The method of claim 1, further comprising, while gathering data related to the picked electrical component, gathering data related to the selected tray support surface on which the stack of trays is stacked.

21. The method of claim 20, wherein each of the multiple tray support surfaces carries a unique, machine-readable identification tag.

22. The method of claim 21, wherein the machine-readable identification tag comprises a bar code label.

23. The method of claim 20, further comprising comparing the gathered data related to the picked electrical component and gathered data related to the selected tray support surface on which the stack of trays is stacked, with a stored correlation between components and support surfaces, to verify proper tray placement.

24. A method of tracking electrical component inventory in a facility containing one or more electrical component placement machines, the method comprising:
providing each of multiple electrical component trays with an associated identification tag, the tags placed in a common orientation on the trays;
stacking a plurality of the trays to form a stack of trays, each tray carrying at least one discrete electrical component, on a selected one of multipiple tray support surfaces of an electrical component placement machine, with one of the stacked trays positioned at a distal end of the stack;
picking an electrical component from the tray at the distal end of the stack, for installation in an electrical assembly;
with the placement machine continuing to operate to pick and place electrical components, gathering data from the identification tag of the tray at the distal end or the stack, the gathered data related to the picked electrical component; and,
updating stored electrical component inventory data based upon the gathered data related to the picked electrical components.

25. A method of forming an association between assembled electrical boards and individual electric components mounted thereon, the method comprising
providing each of multipile electrical component trays with an associated identification tag, the tags placed in a common orientation on the trays;
stacking a plurality of the trays to form a stack of trays, each tray carrying at least one discrete electrical component, on a selected one of multiple tray support surfaces of an electrical component placement machine, with one of the stacked trays positioned at a distal end of the stack;

picking an electrical component from the tray at the distal end of the stack, for installation in an electrical assembly;

with the placement machine continuing to operate to pick and place electrical components, gathering data from the identification tag of the tray at the distal end of the stack, the gathered data related to the picked electrical component; and, storing an association of the identified electrical component with an identification of the electrical board.

26. An electrical component identification system comprising
- a set of tray identification tags secured to associated, stackable trays of electrical components configured to be stacked on one of multiple tray support surfaces of an electrical component placement machine, with one of the stacked trays positioned at a distal end of the stack;
- a tag reader configured to be secured to an electrical component placement machine in a position for reading the identification tag secured to the tray positioned at the distal end of the stack, to gather data therefrom while the placement machine is operated to pick and place electrical components onto a circuit board; and
- a controller configured to be connected to the tag reader for receiving the gathered data from the tag reader related to electrical components on its associated tray.

27. The system of claim 26, wherein the identification tags carry bar codes.

28. The system of claim 26, wherein the identification tags comprise RFID tags.

29. The system of claim 26, wherein the identification tags are releasably attached to respective trays.

30. The system of claim 29, wherein the identification tags are carried on clips configured to be attached at an edge of each tray.

31. The system of claim 26, further comprising a set of machine-readable identification tags configured to be secured to respective ones of the multiple tray support surfaces.

32. The system of claim 31, wherein the machine-readable identification tags comprise bar code labels.

33. The system of claim 31, wherein the controller is configured to compare the gathered data related to the picked electrical component and gathered data related to the selected tray support surface on which the stack of trays is stacked, with a stored correlation between components and support surfaces, to verify proper tray placement.

34. The system of claim 26, wherein the controller is configured to be connected to multiple tag readers on multiple component placement machines, to track electrical component inventory in a facility containing the machines.

35. The system of claim 26, wherein the controller is configured to form an association between assembled electrical boards and individual electrical components mounted thereon, based in part on the gathered data.

36. The system of claim 26, wherein the gathered data comprises tray identification information, and wherein the controller is configured to retrieve component data from a stored correlation of components and trays.

* * * * *